(12) United States Patent
Wang

(10) Patent No.: US 11,011,527 B2
(45) Date of Patent: May 18, 2021

(54) SEMICONDUCTOR STRUCTURE AND STATIC RANDOM ACCESS MEMORY, AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/400,802

(22) Filed: May 1, 2019

(65) Prior Publication Data

US 2019/0348422 A1    Nov. 14, 2019

(30) Foreign Application Priority Data

May 11, 2018 (CN) .......................... 201810448723.6

(51) Int. Cl.
| | | |
|---|---|---|
| *H01L 27/11* | (2006.01) | |
| *H01L 27/092* | (2006.01) | |
| *H01L 21/311* | (2006.01) | |
| *H01L 21/8238* | (2006.01) | |
| *H01L 21/308* | (2006.01) | |

(52) U.S. Cl.
CPC ........ *H01L 27/1104* (2013.01); *H01L 21/308* (2013.01); *H01L 21/31111* (2013.01); *H01L 21/823821* (2013.01); *H01L 21/823878* (2013.01); *H01L 27/0924* (2013.01)

(58) Field of Classification Search
CPC .................... H01L 21/823821; H01L 27/0924
USPC ......................................................... 257/369
See application file for complete search history.

(56) References Cited

U.S. PATENT DOCUMENTS

2017/0365522 A1* 12/2017 Jeong .............. H01L 21/823418

* cited by examiner

*Primary Examiner* — Walter H Swanson
(74) *Attorney, Agent, or Firm* — Anova Law Group, PLLC

(57) ABSTRACT

Semiconductor device, static random access memory (SRAM), and their fabrication methods are provided. The semiconductor device includes a base substrate with first fins formed in adjacent device regions. An isolation structure is formed on the base substrate having a top lower than the first fins. The isolation structure includes a first region and a second region, on opposite sidewalls of a corresponding first fin. The first region is between the adjacent first fins. The isolation structure has a top in the first region higher than that in the second region. A first doped layer is formed in the first fin having a portion in the second region. A dielectric layer is formed over the base substrate and a first contact hole is formed in the dielectric layer to expose a top of the first doped layer and a sidewall surface of the first doped layer, in the second region.

12 Claims, 4 Drawing Sheets

SEMICONDUCTOR STRUCTURE AND STATIC RANDOM ACCESS MEMORY, AND FABRICATION METHODS THEREOF

CROSS-REFERENCE TO RELATED APPLICATION

This application claims the priority of Chinese Patent Application No. 201810448723.6, filed on May 11, 2018, the contents of which are incorporated herein by reference in their entirety.

TECHNICAL FIELD

The present disclosure generally relates to the field of integrated circuits (IC) technology and, more particularly, relates to device and fabrication method of a semiconductor structure, and device and fabrication method of a static random access memory (SRAM) containing the semiconductor structure.

BACKGROUND

With continuous development of digital integrated circuits, digital memory on chips has become an important part in the digital system. Static random access memory (SRAM) is a necessary and important component of digital memory because of its low power consumption and high speed. SRAM saves data without a continuous need of refreshing when supplied electrical power.

Basic SRAM includes six transistors: two pull-up transistors (PU), two pull-down transistors (PD), and two pass-gate transistors (PG). During SRAM memory processes, SRAM requires sufficiently high β ratio (Ipd/Ipg current ratio) for sufficiently high static-noise margin (SNM), and sufficiently high γ ratio (Ipg/Ipu current ratio) to accomplish good writability. Because of different requirements on the pass-gate transistors, there is a conflict between SRAM writability and read stability. However, conventional SRAM does not provide desirable performance.

SUMMARY

One aspect of the present disclosure provides a fabrication method of a semiconductor structure. In the method, a base substrate is provided including adjacent device regions. A first fin is in a device region of the base substrate, and first fins in the adjacent device regions are adjacent to each other. An isolation structure is formed on the base substrate and extending from one device region to an adjacent device region. The isolation structure has a top lower than the first fins and the isolation structure partially covers sidewall surfaces of the first fins. The isolation structure includes a first region and a second region. The first region and the second region are on opposite sidewalls of a corresponding first fin. The first region is positioned between the adjacent first fins. The isolation structure has a top in the first region higher than that in the second region. A first doped layer is formed in the first fin using the isolation structure as a mask. A portion of the first doped layer is in the second region. A dielectric layer is formed on the first doped layer, on the base substrate, and on a portion of the sidewall surface of the first fin. A first contact hole is formed in the dielectric layer to expose a top of the first doped layer and a sidewall surface of the first doped layer, in the second region.

Another aspect of the present disclosure provides a semiconductor structure. The semiconductor structure includes a base substrate, including adjacent device regions. A first fin is in a device region of the base substrate, first fins in the adjacent device regions being adjacent to each other. An isolation structure is on the base substrate and extends from one device region to an adjacent device region. The isolation structure has a top lower than the first fins and partially covers sidewall surfaces of the first fins. The isolation structure includes a first region and a second region. The first region and the second region are on opposite sidewalls of a corresponding first fin. The first region is positioned between the adjacent first fins. The isolation structure has a top in the first region higher than that in the second region. A first doped layer is formed in the first fin. A portion of the first doped layer is formed in the second region. A dielectric layer is formed on the first doped layer, on the base substrate, and on a portion of the sidewall surface of the first fin, the dielectric layer containing a first contact hole exposing a top of the first doped layer and a sidewall surface of the first doped layer, in the second region.

Another aspect of the present disclosure provides a method of fabricating a static random access memory (SRAM), including forming a pass-gate transistor. The pass-gate transistor is formed according to the disclosed method of forming the semiconductor structure.

Another aspect of the present disclosure provides a static random access memory (SRAM). The SRAM includes a pass-gate transistor including the disclosed semiconductor structure.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
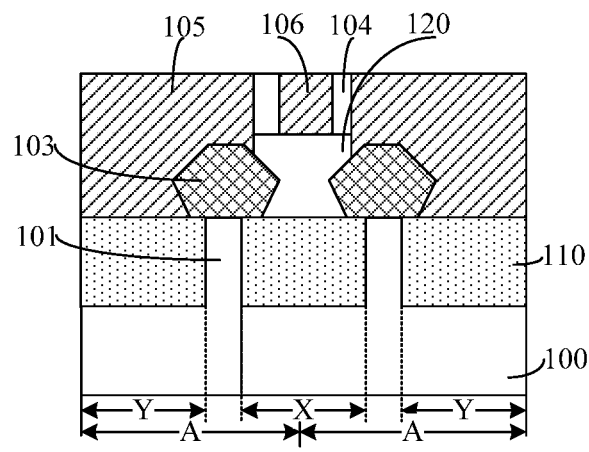
FIG. 1 illustrates a schematic structure of an exemplary SRAM according to various embodiments of the present disclosure.

FIG. 1 illustrates a schematic structure of an exemplary SRAM according to various embodiments of the present disclosure.

Referring to FIG. 1, a base substrate 100 is provided. The base substrate includes: adjacent device regions A; each of the device regions A includes a fin 101 adjacent to another fin 101 positioned in an adjacent device region A; a gate structure 120 across the fin 101; and an isolation structure 110 extending from one device region A to another device region A. The top of the isolation structure 110 is lower than top of the fin 101. The isolation structure 110 covers sidewall surface of the fin 101. The isolation structure 110 includes a first region X and a second region Y. The regions X and Y are in contact with the sidewall surface on corresponding sides of the fin 101. The region X is between the adjacent fins 101. Doped layers 103 are in the fin 101 on each side of the gate structure 120. A portion of the doped layer 103 is in the second region Y. A dielectric layer 104 is on the base substrate 100, on surfaces of the doped layers 103, and on sidewall surfaces of both the fin 101 and the gate structure 120. The dielectric layer 104 includes a first contact hole (not shown), e.g., for forming a first plug 105; and a second contact hole (not shown), e.g., for forming a second plug 106. The bottom of the first contact hole exposes top of the doped layer 103 and the sidewall surface of the dope layer 103 in the second region Y. The bottom of the second contact hole exposes top surface of the gate structure 120 in the first region X. The first plug 105 fills in the first contact hole and a second plug 106 fills in the second contact hole.

In a static random access memory (SRAM), the bottom of the first contact hole exposes only top of the doped layer 103 and the sidewall surface of the doped layer 103 in the second region Y to reduce electrical contact resistance between the first plug 105 and the doped layer 103 and to prevent breakdown of the dielectric layer 104 positioned between two adjacent first plugs 105. However, with continuing increase of circuit density for integrated circuits, the distance between the adjacent fins 101 becomes smaller, making the dielectric layer 104 positioned between the adjacent first plugs 105 on tops of the doped layers 103 more prone to breakdown, thereby to current leakage between the two adjacent first plugs 105.

The bottom of the second contact hole exposes only top surface of the gate structure 120 in the first region X to avoid breakdown of the dielectric layer 104 positioned between the second plug 106 and the first plug 105 and resulting current leakage. However, with continuing increase of circuit density of SRAM, the dimension of the first region X in the width direction of the fin 101 (refer to the direction of measuring width of the fin) becomes smaller. But the dimension of the second contact hole in the width direction of the fin 101 is to be large enough to expose top of the gate structure 120 in the first region X. Thus, given a certain width of the first region X in the width direction of the fin 101, as the distance between the second plug 106 and the first plug 105 becomes smaller, the dielectric layer 104 between the first plug 105 and the second plug 106 is more prone to breakdown, thereby prone to current leakage between the first plug 105 and the second plug 106.

The present disclosure provides a semiconductor structure and its fabrication method. An isolation structure is formed on the base substrate. The isolation structure includes first and second regions. The first and the second regions are in contact with the sidewall surface on corresponding sides of the first fin. The first region is positioned between the adjacent first fins. The top of the isolation structure in the first region is higher than that in the second region. The semiconductor structure fabricated by the above method provides desirable good performance.

FIGS. 2 to 12 illustrate schematic structures corresponding to certain stages for fabricating an exemplary semiconductor structure according to various embodiments of the present disclosure.

Figure 2:
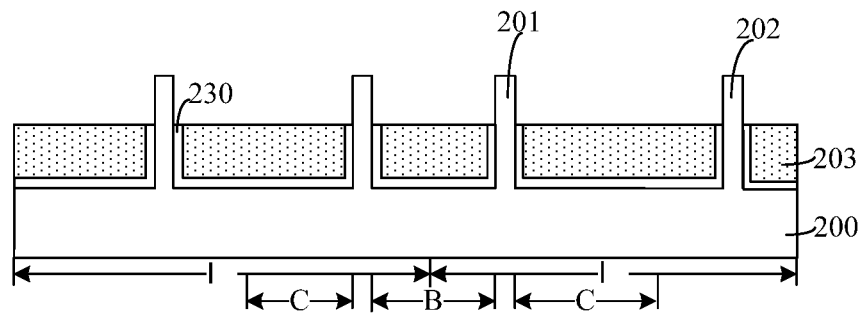
FIGS. 2 to 12 illustrate schematic structures corresponding to certain stages for fabricating an exemplary semiconductor structure according to various embodiments of the present disclosure.
Figure 3:
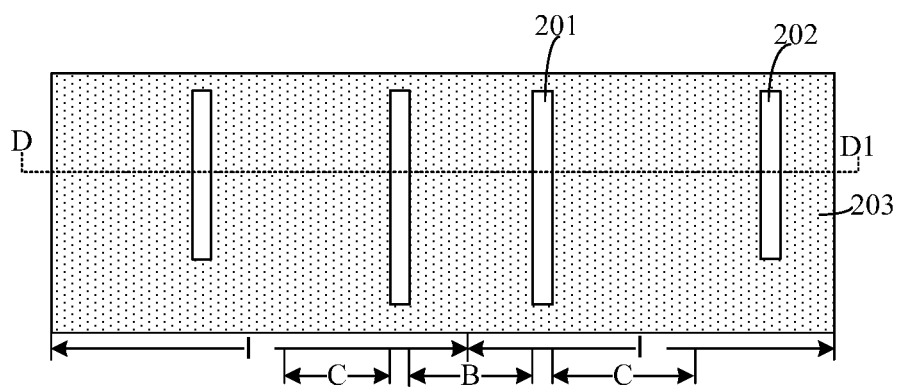

FIGS. 2 and 3 illustrates a structure for forming the exemplary semiconductor structure. FIG. 3 is a top view, while FIG. 2 is a cross-sectional view along D-D1 line in FIG. 3. A base substrate 200 is provided. The base substrate 200 includes adjacent device regions I. One device region I includes a first fin 201, adjacent to another first fin 201 positioned on an adjacent device region I. The base substrate 200 also includes an initial isolation structure 203. The top surface of the initial isolation structure 203 is lower than top of the first fin 201. The initial isolation structure 203 covers a portion of the sidewall surface of the first fin 201. The initial isolation structure 203 includes a first region B and a second region C. The regions B and C are in contact with the sidewall surface on the corresponding sides of the first fin 201, as shown in FIGS. 2-3. The first region B is positioned between the adjacent first fins 201.

In one embodiment, the device region I is used for fabricating a SRAM.

In other embodiments, the device region may be used in fabricating a PMOS transistor or an NMOS transistor.

In one embodiment, the first fin 201 may be used as a fin for a pass-gate transistor and for a pull-down transistor.

In one embodiment, a second fin 202 is formed on the base substrate 200 on the sides of the first fin 201 in the adjacent device region I. The second fin 202 is used as a fin for a pull-up transistor.

In other embodiments, the second fin may be a fin for other transistors, for example, an NMOS transistor or a PMOS transistor.

In one embodiment, the formation of the base substrate 200, the first fin 201, and the second fin 202 includes: providing an initial base substrate; the initial base substrate surface including a first mask layer (not shown); the first mask layer exposing a portion of the top surface of the initial base substrate; etching the initial base substrate using the first mask layer as a mask to form the base substrate 200, and a number of both first fins 201 and second fins 202 on the base substrate 200.

In one embodiment, the initial base substrate is made of silicon material. The same silicon material is for the base substrate 200, for the first fin 201, and for the second fin 202.

In other embodiments, the initial base substrate includes germanium, silicon germanium, silicon on insulator, germanium on insulator, and/or silicon germanium on insulator. In an exemplary embodiment, same materials may be selected for the base substrate, for the first fin, and for the second fin.

The first mask layer may be made of silicon nitride or titanium nitride.

When etching the initial base substrate using the first mask layer as a mask, a dry etching process and/or a wet etching process may be used. The first fins 201 in the adjacent device regions I are adjacent to each other. In other words, there is no other fin(s) between the adjacent first fins 201 in the adjacent device regions I. In an actual fabrication process, the distance between adjacent first fins 201 in adjacent device regions I is fixed, for example, in a range from about 84 nm to about 88 nm.

Before forming the initial isolation structure 203, an oxide layer 230 is formed on the following surfaces: a surface of the base substrate 200, and the sidewall surfaces and top surfaces of both the first fin 201 and the second fin 202.

In one embodiment, the oxide layer 230 may be made of silicon oxide. The process for forming the oxide layer 230 includes an in-situ steam generation (ISSG) process.

The oxide layer 230 prepared by the in-situ stream generated process has a high density. When subsequently forming an isolation material film, the oxide layer 230 provides protection and prevents damage for the following surfaces: a surface of the base substrate 200, and the sidewall surfaces and top surfaces of both the first fin 201 and the second fin 202.

The process for forming the initial isolation structure 203 includes: forming an isolation material film on the oxide layer 230; and removing a portion of the isolation material film to form the initial isolation structure 203.

The isolation material film may be made of silicon oxide or silicon oxynitride. The same materials may be selected for the initial isolation structure 203. The process for forming the isolation material film includes chemical vapor phase deposition process or physical vapor deposition process.

The process for removing a portion of the isolation material film includes dry etching and/or wet etching processes.

When removing a portion of the isolation material film, the portions of the oxide layer 230 that cover a portion of the sidewalls and top surfaces of both the first fin 201 and the second fin 202 are removed to expose the surfaces thereof.

The initial isolation structure 203 is used as electrical insulation among different semiconductor devices.

Figure 4:
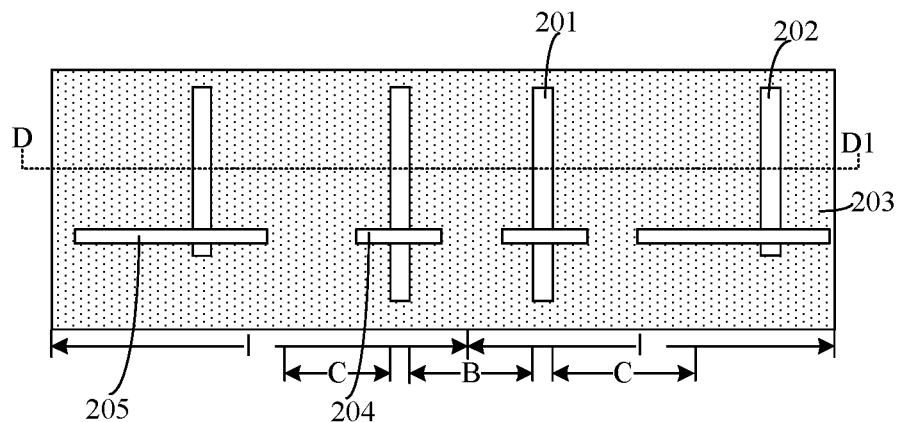
Figure 5:
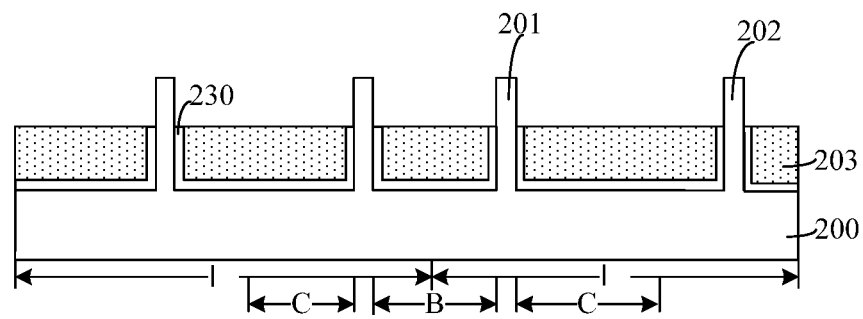

FIGS. 4 and 5 illustrate a structure for forming the exemplary semiconductor structure. FIG. 4 is a top view, while FIG. 5 is a cross-sectional view along D-D1 line in FIG. 4. As illustrated, a first gate structure 204 is formed across the first fin 201 and a second gate structure 205 is formed across the second fin 202.

In one embodiment, a third gate structure (not shown) is formed across the first fin 201. The third gate structure is used as a gate structure for a pull-down transistor. The first gate structure 204, the second gate structure 205, and the third gate structure are formed simultaneously. In other embodiments, a third gate structure may not be needed.

In other embodiments, the second and the third gate structures may be formed after forming the first gate structure; or the second and the third gate structures may be formed before forming the first gate structure.

In one embodiment, the process of forming the first gate structure 204, the second gate structure 205, and the third gate structure includes: forming a gate dielectric layer and a gate layer on the gate dielectric layer on the sidewall surfaces and on the top surfaces of both the first fin 201 and the second fin 202; the gate layer including a second mask layer that exposes a portion of the top surface of the gate layer; etching the gate layer and the gate dielectric layer using the second mask layer as a mask, to form the first gate structure 204 spanning the first fin 201, to form the second gate structure 205 spanning the second fin 202, and to form the third gate structure.

The gate dielectric layer may be made of silicon oxide. The process of forming the gate dielectric layer includes: chemical vapor deposition process, physical vapor deposition process, or atomic layer deposition process.

The gate layer may be made of silicon material. The process of forming the gate layer includes: chemical vapor deposition process, physical vapor deposition process, or atomic layer deposition process.

The second mask layer may be made of silicon nitride or titanium nitride. The second mask layer is used as a mask when forming the first gate structure 204 and the second gate structure 205.

The etching process for the gate layer using the second mask layer as a mask includes a dry etching process and/or a wet etching process.

The etching process for the gate dielectric layer using the second mask layer as a mask includes a dry etching process and/or a wet etching process.

In one embodiment, the first gate structure 204 is used as a gate structure for a pass-gate transistor in SRAM; and the second gate structure 205 is used as a gate structure for a pull-up transistor in SRAM.

Figure 6:
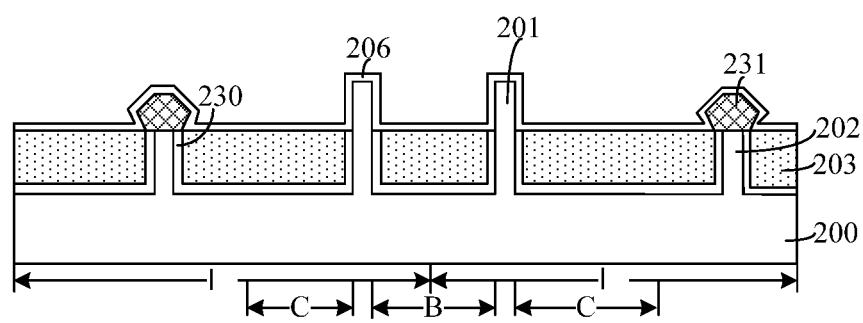

Referring to FIG. 6, second doped layers 231 are formed in the second fin 202 on each side of the second gate structure 205. A sidewall film 206 is formed on surfaces of the second doped layers 231, and on the sidewall surfaces and top surfaces of both the first gate structure 204 and the second gate structure 205.

In one embodiment, after forming the third gate structure and before forming the sidewall film, third doped layers (not shown) are formed in the first fin 201 on each side of the third gate structure. The third doped layer is used as a doped layer for a pull-down transistor in SRAM. The sidewall film 206 covers the sidewall surface and the top surface of the third gate structure, and the top surfaces of the third doped layers.

Before forming the second doped layers 231, a second photoresist layer (not shown) is formed on the surface of the initial isolation structure 203 in the first region B, and on the sidewall surface and the top surface of the first fin 201.

When forming the second doped layers 231 and the third doped layers, the second photoresist layer protects the top of the initial isolation structure 203 in the first region B, and the sidewall surface and the top surface of the first fin 201.

The process for forming the second doped layers 231 includes: forming second source/drain openings in the second fin 202 on each side of the second gate structure 205; forming a second epitaxial layer in the second source/drain opening; and doping second source/drain ions in the second epitaxial layer to form the second doped layer 231.

Material for the second epitaxial layer and conductivity type of the second source/drain ions are related to the transistor type. For example, the second doped layer 231 may be used as a doped layer for a pull-up transistor in SRAM, and all the pull-up transistors are PMOS transistors, then the second epitaxial layer is made of silicon germanium or silicon, and the second source/drain ion is a P type ion, for example, boron ion.

The sidewall film 206 may be made of silicon nitride or silicon oxynitride. The process for forming the sidewall film 206 includes chemical vapor deposition process, physical vapor deposition process, or atomic layer deposition process.

Figure 7:
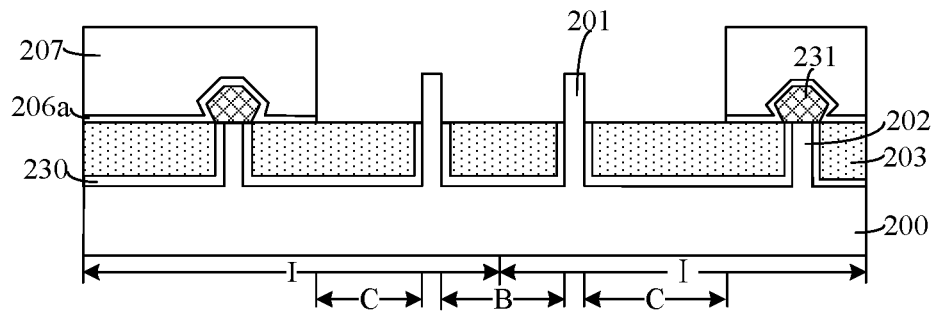

Referring to FIG. 7, after forming the sidewall film 206, a first photoresist layer 207 is formed on the sidewall surface and the top surface of the second gate structure 205, and on surfaces of the second doped layers 231. The first photoresist layer 207 exposes the sidewall film 206 in the first region B and the second region C. After forming the first photoresist layer 207, a portion of the sidewall film 206 is removed from the following surfaces: the sidewall surface and top surface of the first fin 201, the surface of the initial isolation structure 203 both in the first region B and in the second region C to form a sidewall 206a covering tops of the second doped layers 231, surfaces of the sidewall and top of the second gate structure 205, and sidewall surface of the first gate structure 204.

The first photoresist layer 207 protects the tops of the second doped layers 231, and the sidewall surface and the top surface of the second gate structure 205.

The process of removing a portion of the sidewall film 206 from the sidewall surface and top surface of the first fin 201, and from surface of the initial isolation structure 203 both in the first region B and in the second region C includes: a dry etching process and/or a wet etching process.

The sidewall 206a attached to sidewall surface of the first gate structure 204 determines position of later formed first doped layers.

Figure 8:
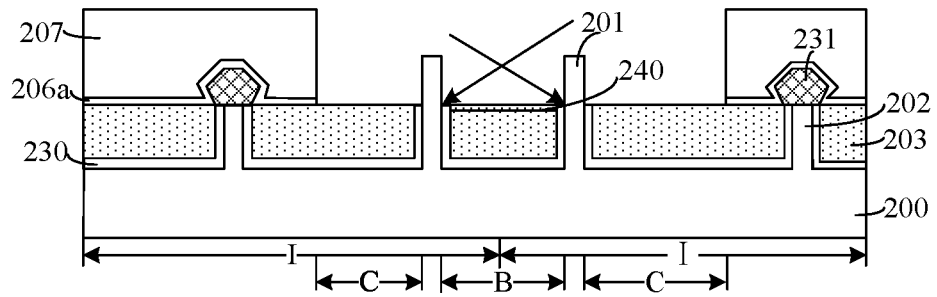

Referring to FIG. 8, after forming the sidewall 206a, the first photoresist layer 207 and the first fin 201 are used as doping masks, and ions are doped into an upper portion of the initial isolation structure 203 at least partially in the first region B to form a blocking region 240.

In one embodiment, the ions are doped, by an ion implantation process, into the upper portion of the initial isolation structure 203 in the first region B using the first photoresist layer 207 and the first fin 201 as doping masks.

In other embodiments, the process of doping ions into the upper portion of the initial isolation structure in the first region B using the first photoresist layer and the first fin as doping masks may include: forming a blocking layer on top of the initial isolation structure in the first region, the blocking layer containing doped ions; and conducting an annealing treatment to introduce the doped ions from the blocking layer into the initial isolation structure to form the blocking region in the upper portion of the initial isolation structure.

The doped ions include, for example, nitrogen ion, boron ion, and/or fluoride ion.

In one embodiment, parameters of the ion implantation process include: when the doped ion is nitrogen ion, the implantation dose is about 5E13 atoms/cm$^2$ to about 1E15 atoms/cm$^2$, the implantation energy is about 0 keV to about 5 keV, and the implantation angle is about 15 degrees to about 30 degrees. The implantation angle is the angle between the ion velocity and the normal to a top surface of the base substrate 200.

The implantation dose of the doped ions is chosen based on the following considerations: if the implantation dose of the doped ions is less than 5E13 atoms/cm$^2$, the removal rate in the later formed blocking region would still be high, leading to a reduced height difference between tops of the isolation structure in the first region B and in the second region C. Thus, when later forming the first doped layer in the source/drain opening using the isolation structure as a mask, the limiting ability of the isolation structure in the first region B for morphology of the first doped layer would be weak, resulting in a reduced offset of the first doped layer to the second region C, and a reduced distance between the later formed first plugs on tops of the adjacent first doped layers, thereby making the dielectric layer positioned between the adjacent first plugs prone to breakdown and to current leakage between the adjacent first plugs. If the implantation dose of the doped ions is greater than 1E15 atoms/cm$^2$, the doping of ions would become difficult.

The implantation angle is chosen based on the following considerations: if the implantation angle is less than 15 degrees, the ions would also be implanted into top of the initial isolation structure in the second region C, the limiting ability of the later formed isolation structure in the second region C for the first doped layer would be strong, resulting in a reduced volume of the first doped layer in the second region C, a reduced contact area between the first doped layer and the later formed first plug on top of the first doped layer, and an increased electrical contact resistance between the first doped layer and the first plug. If the implantation angle is greater than 30 degrees, the implantation dose of the doped ions into the initial isolation structure in the first region B would be low, removal rate of the initial isolation structure in the first region B would still be high, the limiting ability of the later formed isolation structure in the first region B for the first doped layer would be weak, leading to a reduced offset of the first doped layer to the second region C and a decreased distance between the later formed first plugs on tops of the adjacent first doped layers, thereby making the dielectric layers positioned between the adjacent first plugs prone to breakdown and to current leakage between the adjacent first plugs.

The doping of ions into the initial isolation structure 203 is in the first region B instead of in the second region C, creating etching selectivity in the initial isolation structures 203 between the regions B and C, with the beneficial result that the top of the later formed isolation structures 250 in the first region B is higher than that in the second region C.

Figure 9:
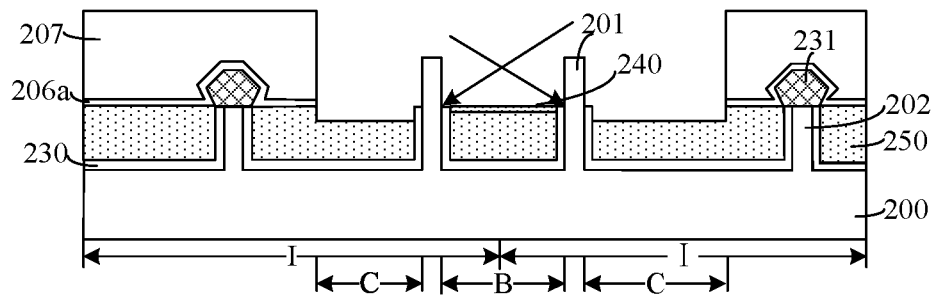

Referring to FIG. 9, after forming the blocking region 240, a portion of the initial isolation structure 203 in the second region C is removed to form isolation structure 250. The top of the isolation structure 250 in the first region B is higher than that in the second region C.

The process of removing a portion of the isolation structure 203 in the second region C includes a wet etching process and/or a dry etching process.

Because the doped ions are in the top of the initial isolation structure 203 in the first region B but not in the second region C, an etching selectivity exists in the initial isolation structure 203 between the first region B and second region C. While removing a portion of the initial isolation structure 203 in the second region C, the removal rate of the initial isolation structure 203 in the first region B is slower, resulting in the top of the isolation structure 250 in the first region B higher than that in the second region C.

Because the top of the isolation structure 250 in the first region B is higher than that in the second region C, the isolation structure 250 in the first region B has an increased blocking ability for the later formed first doped layer while the isolation structure 250 in the second region C has a decreased blocking ability for the first doped layer. This difference in blocking abilities has a beneficial result of an offset of the first doped layer to the second region C, resulting in an increased distance between the first plugs on tops of the adjacent first doped layers, making the dielectric layer positioned between the adjacent first plugs not prone either to breakdown or to current leakage between the first plug and the second plug.

Figure 10:
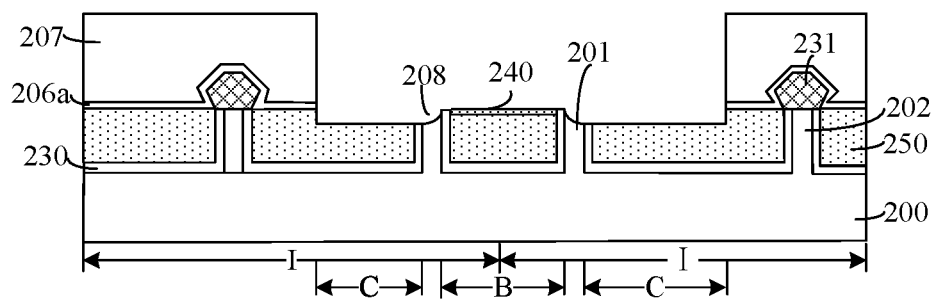

Referring to FIG. 10, after forming the isolation structure 250, a portion of the first fin 201 is removed to form a first source/drain opening 208.

The process of forming the first source/drain opening 208 includes a dry etching process and/or a wet etching process.

The first source/drain opening 208 is to accommodate a later formed first doped layer.

Figure 11:
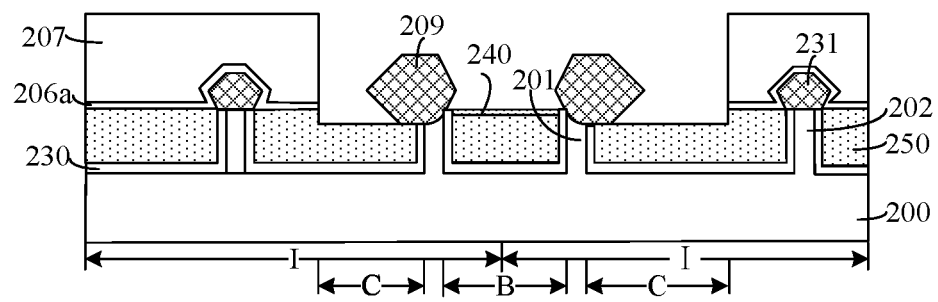

Referring to FIG. 11, a first doped layer 209 is formed in the first source/drain opening 208 (shown in FIG. 10).

The process of forming the first doped layer 209 includes: forming a first epitaxial layer in the first source/drain opening 208; and doping the first source/drain ions into the first epitaxial layer to form a first doped layer 209.

In one embodiment, the first doped layers 209 are used in a pass-gate transistor in SRAM, and the pass-gate transistor is a NMOS transistor. The first epitaxial layer is made of silicon carbide or silicon, and the first source/drain ion is an N type ion, for example, boron ion or arsenic ion.

When forming the first doped layer 209, because the isolation structure 250 for the first doped layer 209 has a strong limiting ability in the first region B and a weak limiting ability in the second region C, the first doped layer 209 is offset toward the second region C, leading to an increased distance between the later formed first plug on top of the first doped layer 209 and the second plug on top of the first gate structure 204, thereby resulting in the dielectric layer positioned between the first plug and the second plug not prone either to breakdown or to current leakage between the first plug and the second plug.

Figure 12:
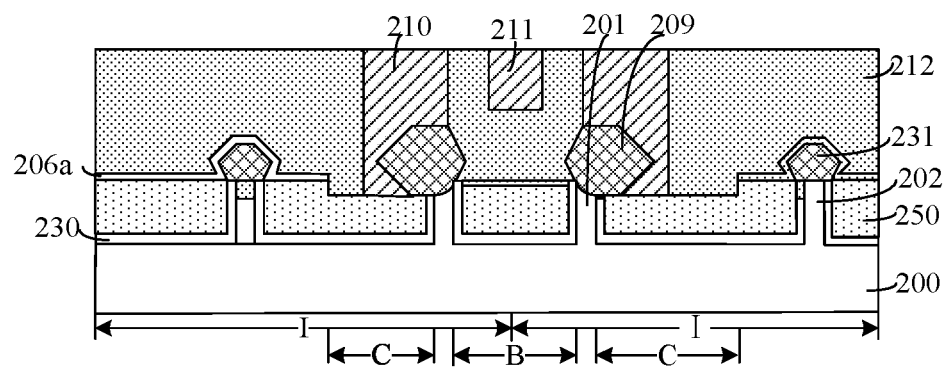

Referring to FIG. 12, a dielectric film (not shown) is formed on the following surfaces: the sidewall surfaces and top surfaces of both the first gate structure 204 and the second gate structure 205, and surfaces of both the first doped layers 209 and the second doped layers 231. A portion of the dielectric film is removed to form a dielectric layer 212. The dielectric layer 212 includes a first contact hole (not shown). The bottom of the first contact hole exposes top of the first doped layer 209 and the sidewall surface of the first doped layer 209 in the second region C. The dielectric layer 212 includes a second contact hole (not shown). The bottom of the second contact hole exposes top of the first gate structure 204 in the first region B. A first plug 210 is formed inside of and filling up the first contact hole. A second plug 211 is formed inside of and filling up the second contact hole.

In one embodiment, the dielectric layer is made of silicon oxide or silicon oxynitride. The process of forming the dielectric film includes chemical vapor deposition process or physical vapor deposition process.

The process of removing a portion of the dielectric layer includes a dry etching process and/or a wet etching process.

The bottom of the first contact hole exposes the top of the first doped layer 209 and the sidewall surface of the first doped layer 209 in the second region C. The exposure by the first contact hole does not include the sidewall surface of the first doped layer 209 in the first region B based on the following considerations: preventing the distance between the later formed first plugs 210 in adjacent first contact holes from becoming so short as to cause the dielectric layer 212 positioned between the adjacent plugs 210 to break down and result in current leakage between the adjacent plugs 210.

The bottom of the second contact hole exposes only top of the first gate structure 204 in the first region B, based on the consideration to increase distance between the later formed second plug 211 inside of the second contact hole and the first plug 210 to prevent current leakage between the second plug 211 and the first plug 210.

The process of forming the first plug 210 and the second plug 211 includes: forming a plug film inside of the first contact hole, inside of the second contact hole, and on surface of the dielectric layer 212; and performing planarization of the plug film to form the first plug 210 inside of the first contact hole and the second plug 211 inside of the second contact hole.

The plug film is made of metal including tungsten, copper, or aluminum. The process of forming the plug film includes: chemical vapor deposition process or physical vapor deposition process. The process of planarization of the plug film includes a chemical mechanical polishing process. The distance between the first plug 210 and the second plug 211 is, for example, about 10 nm to about 14 nm.

Because of an offset of the first doped layer 209 to the second region C, the distances between the adjacent first plugs 210 and between the first plug 210 and the second plug 211 are increased. Thus, the dielectric layer 212 positioned between the adjacent first plugs 210 and between the first plug 210 and the second plug 211 are not prone either to breakdown or to current leakage between the adjacent first plugs 210 and between the first plug 210 and the second plug 211.

The present disclosure provides a semiconductor structure in reference to FIG. 12. In the semiconductor structure, a base substrate 200 includes adjacent device regions I. A first fin 201 is on a surface of the base substrate 200 of the device region I. The first fins 201 on adjacent device regions I are adjacent to each other.

An isolation structure 250 extends from one device region I to another adjacent device region I. The top of the isolation structure 250 is lower than top of the first fin 201. The isolation structure 250 covers a portion of the sidewall surface of the first fin 201. The isolation structure 250 includes a first region B and a second region C. The first region B and the second region C of the isolation structure 250 are formed on or sometimes in contact with the sidewall surface of corresponding first fins 201. The first region B of the isolation structure 250 is positioned between the adjacent first fins 201. The top of the isolation structure 250 in the first region B is higher than that in the second region C.

First doped layers 209 are formed in the first fin 201. A portion of the first doped layer 209 is in the second region C.

A dielectric layer 212 is deposited on the first doped layers 209, on the base substrate 200, and on sidewall surface of the first fin 201. The dielectric layer 212 includes a first contact hole (not shown). The bottom of the first contact hole exposes top of the first doped layer 209 and the sidewall surface of the first doped layer 209 in the second region C.

The distance between the adjacent first fins is about 84 nm to about 88 nm.

A portion of the first doped layer is formed in the first region B. Volume of the first doped layer 209 in the first region B is less than that in the second region C.

The semiconductor structure of the present disclosure further includes: a first gate structure 204 across the first fin 201 (shown in FIG. 4). The dielectric layer 212 covers sidewall surface of the first gate structure 204 and includes a second contact hole (not shown). The second contact hole exposes the top of the first gate structure 204 in the first region B. A first plug 210 is formed inside of the first contact hole and a second plug 211 is formed inside of the second contact hole.

The distance between the first plug 210 and the second plug 211 is about 10 nm to about 14 nm.

The height difference between tops of the isolation structure 250 in the first region B and the second region C is about 1 nm to about 5 nm.

The present disclosure further provides an SRAM and fabrication method thereof. The fabrication method at least includes forming a pass-gate transistor containing the disclosed semiconductor structure.

Optionally, pass-gate transistors in adjacent device regions are adjacent to each other. The process of forming an SRAM further includes forming pull-up transistors and pull-down transistors on the device region of the base substrate. The pull-up transistor includes a second fin on the base substrate on either side of the pass-gate transistors, a second gate structure across the second fin, and second doped layers in the second fin on each side of the second gate structure. The pull-down transistor includes the first fin, a third gate structure across the first fin, and third doped layers in the first fin on each side of the third gate structure.

In one embodiment, the SRAM includes two pass-gate transistors, two pull-up transistors, and two pull-down transistors.

Compared to the conventional structures and methods, the semiconductor structures and their fabrication methods of the present disclosure provides following advantages:

For example, the top of the isolation structure in the first region is higher than that in the second region. Thus, the isolation structure in the first region has a greater limiting ability for the first doped layer, leading to an offset of the first doped layer to the second region, thereby leading to an increased distance between adjacent first doped layers and an increased distance between adjacent first plugs positioned in tops of the adjacent first doped layers. The increased distance between adjacent first plugs makes the dielectric layer positioned between two adjacent first plugs not prone either to breakdown or leakage current between two adjacent plugs. Because of low thickness of the isolation structure in the second region, the isolation structure in the second region has low limiting ability for the first doped layer, leading to an increased volume of the first doped layer in the second region. The bottom of the first contact hole exposes the top of the first doped layer and the sidewall surface of the first doped layer in the second region. Thus, the contact area between the first plug and the first doped layer is high, which is beneficial in reducing electrical contact resistance between the first plug and the first doped layer.

Furthermore, after forming the initial isolation structure and before forming the blocking region, a first gate structure is formed across the first fin. The dielectric layer includes a second contact hole that exposes top of the first gate structure. The second contact hole is in the first region to decrease current leakage between the later formed second plug inside of the second contact hole and the first plug inside of the first contact hole. An offset of the first doped layer to the second region introduces an increased distance between the first plug on top of the first doped region and the second plug inside of the second contact hole. Thus, dielectric layer between the first plug and the second plug is not prone either to breakdown or to have leakage current between the first plug and the second plug.

Further, in a specific example of a six transistor SRAM cell having fixed PG fin to PG fin spacing and M0G-to-M0 spacing about 12 nm in layout, the M0G-to-M0 spacing would be marginal for avoiding chip yield loss due to M0G-M0 short (WL M0G to internal node M0). With respect to FIGS. 2 to 12, similarly, the PG fin to PG fin spacing is that of the two adjacent fins 201 separated by the first region B. Each PG fin is crossed by a first gate structure 204. First doped layers 209 are in the PG fin on each side of the first gate structure 204. The first doped layer 209 includes a source/drain region. Electrical contact to the first layer 209 is made by the first plug 210. M0 may correspond to the first plug 210. Two PG transistors of one SRAM cell includes four M0 contacts. The WL M0G is the contact made in the first region B to gate structures 204 of both PG transistors by one second plug 211.

To solve the M0G-M0 metal short issue, the PG fin epitaxial growth locations are shifted away from M0G, so that M0 moves with spacing between the epitaxial layer and M0-M0G increases. In one example, after following standard process flow for forming fin, dummy gate, and spacer, further processes may include: PMOS epitaxial SiGe growth for PU transistors on second fins 202, deposition of a nitride layer to cover fin area, and deposition of oxide deposition layer (ODL); patterning of a photoresist layer to open NMOS area of the device regions of the two adjacent fins 201 and then a nitride etch. The shift of the PG fin epitaxial growth locations away from M0G may be realized. An increase of M0G-M0 spacing of about 3 nm to about 5 nm is easily obtained, in an example.

A titled implant is applied into a center of shallow trench isolation (STI) (e.g., oxide) to form a blocking region (for example, including ion species of N, B, F, etc.). Such STI oxide may correspond to the isolation structure 250 as described herein. The blocking effect results in a height difference of STI which moves fin epitaxial growth location further away from M0G. Here, the fin epitaxial growth region corresponds to location of the first doped layer 209 formed in the first source/drain opening 208 (shown in FIG. 10). The STI height difference corresponds to the top of the isolation structure being higher in the first region B than that in the second region C.

In one example, implantation angle is between 30 and 60 degrees for less than 5 keV low energy and implant species can be N, B, F, to block oxide loss in STI oxide recess etching. Here, the implantation angle is applied during the doping process for forming a blocking layer in the first region B. Photoresist (PR) may be used to deposit the blocking layer between PG to PG fins to form STI height difference. Additional thermal treatment after formation of the blocking layer may be used to repair implantation damage and for a better blocking effect.

According to various embodiments, the disclosed semiconductor structure and its fabrication method is not limited for the SRAM. For example, the disclosed semiconductor structure and its fabrication method may also be used to solve metal short issue in any other suitable integrated circuits.

The embodiments disclosed herein are exemplary only. Other applications, alterations, modifications, or equivalents to the disclosed embodiments are obvious to professionals skilled in the art and are intended to be encompassed within the scope of the present disclosure. The protection of the present disclosure is limited by the scope of the claims only.

What is claimed is:

1. A semiconductor structure, comprising:
   a base substrate, including two device regions adjacent to each other, wherein a first fin is in each of the two device regions;
   an isolation structure, on the base substrate and extending across the two device regions, wherein:
     the isolation structure has a top lower than the first fine and partially covers sidewall surfaces of the first fine, and
     the isolation structure includes a first region and a second region; the first region and the second region are on opposite sidewalls of the first fin; the first region is positioned between adjacent first fins; and the isolation structure has a first top in the first region higher than a second top in the second region;
   a first doped layer, formed in the first fin, wherein a portion of the first doped layer is formed in the second region; and
   a dielectric layer, formed on the first doped layer, on the base substrate, and on a portion of the sidewall surfaces of the first fin, the dielectric layer containing a first contact hole, wherein a bottom of the first contact hole exposes a first sidewall surface of the first doped layer in the second region and a top of the first doped layer.

2. The semiconductor structure according to claim 1, wherein a distance between the adjacent first fins is about 84 nm to about 88 nm.

3. The semiconductor structure according to claim 1, wherein:
   a portion of the first doped layer is formed in the first region; and
   the first doped layer has a volume in the first region less than that in the second region.

4. The semiconductor structure according to claim 1, further including:
   a first gate structure, formed across the first fin, wherein the dielectric layer covers surfaces of a sidewall and a top of the first gate structure, and the dielectric layer contains a second contact hole exposing the top of the first gate structure in the first region;

a first plug in the first contact hole; and a second plug in the second contact hole.

5. The semiconductor structure according to claim 4, wherein a distance between the first plug and the second plug is about 10 nm to about 14 nm.

6. The semiconductor structure according to claim 1, wherein a height difference between the tops of the isolation structure in the first region and the second region is about 1 nm to about 5 nm.

7. A static random access memory (SRAM), comprising:
a pass-gate transistor including the semiconductor structure according to claim 1.

8. The SRAM according to claim 7, further including:
a pull-up transistor and a pull-down transistor, formed on the base substrate,
the pull-up transistor including:
  a second fin, formed on the base substrate on a side of the pass-gate transistor;
  a second gate structure, across the second fin; and
  second doped layers, formed in the second fin on each side of the second gate structure;
the pull-down transistor including:
  the first fin;
  a third gate structure, across the first fin;
  third doped layers, formed in the first fin on each side of the third gate structure; and
wherein the SRAM including two of the pass-gate transistor, two of the pull-up transistor, and two of the pull-down transistor.

9. The semiconductor structure according to claim 1, wherein:
the first doped layer is not symmetrical to the first fin.

10. The semiconductor structure according to claim 1, wherein:
the first doped layer is biased towards the second region and against the first region.

11. The semiconductor structure according to claim 1, wherein:
a second sidewall surface of the first doped layer is completely covered by the dielectric layer.

12. The semiconductor structure according to claim 1, wherein:
a blocking region formed on the first region of the isolation structure.

\* \* \* \* \*